United States Patent
Qiu et al.

(10) Patent No.: US 11,081,305 B2
(45) Date of Patent: Aug. 3, 2021

(54) METHOD, CONTROLLER AND SYSTEM FOR REGULATING A CURRENT OF A COIL

(71) Applicant: Schneider Electric Industries SAS, Rueil Malmaison (FR)

(72) Inventors: Jian Qiu, Shanghai (CN); Baoyun Bi, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 120 days.

(21) Appl. No.: 16/519,290

(22) Filed: Jul. 23, 2019

(65) Prior Publication Data

US 2020/0035431 A1    Jan. 30, 2020

(30) Foreign Application Priority Data

Jul. 27, 2018 (CN) .......................... 201810848144.0

(51) Int. Cl.
  *H01H 47/32* (2006.01)
  *H01H 50/44* (2006.01)
  *H02H 9/00* (2006.01)
  *H03K 7/08* (2006.01)

(52) U.S. Cl.
  CPC ............ *H01H 47/32* (2013.01); *H01H 50/44* (2013.01); *H02H 9/002* (2013.01); *H03K 7/08* (2013.01)

(58) Field of Classification Search
  CPC ...... H02H 9/002; H01H 47/32; H01H 47/325; H01H 50/44
  See application file for complete search history.

(56) References Cited

U.S. PATENT DOCUMENTS 5,933,313 A * 8/1999 Furukawa .............. G05B 11/28
                                                            361/152
6,317,308 B1    11/2001 Durif et al.
10,261,532 B1 * 4/2019 Yasuda .............. H03K 17/6871
(Continued)

FOREIGN PATENT DOCUMENTS

CN          101197543 A    6/2008
CN          206421993 U    8/2017
FR          2568715        2/1986

OTHER PUBLICATIONS

Office Action for Korean Patent Application No. 10-2019-0088920 dated Jul. 24, 2020, 4 pages.
(Continued)

*Primary Examiner* — Harry R Behm
(74) *Attorney, Agent, or Firm* — Locke Lord LLP

(57) ABSTRACT

Embodiments of the present disclosure provide method, controller and system for regulating a current of a coil. The method comprises: obtaining a first sample value of the current of the coil at a first moment, the first sample value being associated with a duty cycle of a PWM signal applied to a control end of a switch and the switch being coupled in series with the coil; obtaining a second sample value of the current of the coil at a second moment; determining a difference value between the first and the second sample values; and updating the duty cycle of the PWM signal based on the difference value to regulate the current of the coil. According to embodiments of the present disclosure, the inrush current of the coil generated at the moment of closing the contactor can be limited to a target current value, so as to increase the service life of the contactor.

15 Claims, 2 Drawing Sheets

(56) References Cited

U.S. PATENT DOCUMENTS

| | | | |
|---|---|---|---|
| 2004/0125968 A1* | 7/2004 | Pearce | H03F 3/72 381/120 |
| 2008/0136403 A1* | 6/2008 | Deck | G01R 15/08 324/110 |
| 2009/0027823 A1 | 1/2009 | Follic et al. | |
| 2014/0254058 A1* | 9/2014 | Suzuki | H01H 47/325 361/153 |
| 2018/0174786 A1* | 6/2018 | Matsuo | H01F 7/1844 |
| 2018/0218862 A1* | 8/2018 | Matsuo | H01F 7/1844 |

OTHER PUBLICATIONS

English Language Translation of Office Action for Korean Patent Application No. 10-2019-0088920 dated Jul. 24, 2020, 3 pages.
English Language Machine Translation of French Patent Application Publication No. FR2568715 published dated Feb. 7, 1986, 10 pages.
Extended European Search Report for European Patent Application No. 19305959.9 dated Jan. 22, 2020, 9 pages.
Chinese Office Action dated Apr. 21, 2021 for corresponding Chinese Patent Application No. 201810848144.0, 18 pages.

\* cited by examiner

US 11,081,305 B2

METHOD, CONTROLLER AND SYSTEM FOR REGULATING A CURRENT OF A COIL

FIELD

Embodiments of the present disclosure relate to a method, a controller and a system for regulating a current of a coil.

BACKGROUND

A coil of a contactor is a common electrical component and voltages of control signals are directly applied to the coil through current-limiting resistance. The working states of the coil of the contactor can basically be divided into the following: an inrush state, a holding state and an opening state. The inrush current generated during closing the contactor is generally at least 15 times greater than the holding current for holding the coil. The contactor will open and close several million times during its entire service cycle and such a frequent inrush current would greatly reduce the service life of the coil. Therefore, it is vital to control the magnitude of the inrush current.

SUMMARY

Embodiments of the present disclosure provide a method, a controller and a system for regulating a current of a coil, especially the inrush currents of the coil which intends to at least partially address the above and/or other potential problems in coil design.

In a first aspect, embodiments of the present disclosure relate to a method of regulating a current of a coil of a contactor. The method comprises: obtaining a first sample value of the current of the coil at a first moment, the first sample value being associated with a duty cycle of a PWM signal applied to a control end of a switch, and the switch being coupled in series with the coil; obtaining a second sample value of the current of the coil at a second moment; determining a difference value between the first and the second sample values; and updating the duty cycle of the PWM signal based on the difference value to regulate the current of the coil.

According to embodiments of the present disclosure, the impact of the inrush current on supply power can be limited when closing the contactor, which reduces the risk of burning coil and increases the service life of the coil. Besides, threshold values of closing and holding currents can be precisely defined depending on the requirements of different coil capacities.

In some embodiments, the method further comprises: determining a voltage mean value of a voltage of the coil; determining an inrush voltage value when the contactor is being closed; and determining an initial value of the duty cycle based on the voltage mean value and the inrush voltage value.

In some embodiments, updating the duty cycle of the PWM signal based on the difference value comprises: updating the duty cycle based on a product of the difference value and an empirical coefficient.

In some embodiments, determining the initial value of the duty cycle based on the voltage mean value and the inrush voltage value comprises: determining the initial value of the duty cycle based on a ratio of the voltage mean value to the inrush voltage value.

In a second aspect, embodiments of the present invention relate to a controller for regulating a current of a coil of a contactor, comprising: a control unit configured to: obtain a first sample value of the current of the coil at a first moment, the first sample value being associated with a duty cycle of a PWM signal applied to a switch and the switch being coupled in series with the coil; obtain a second sample value of the current of the coil at a second moment; determine a difference value between the first and the second sample values; and update the duty cycle of the PWM signal based on the difference value to regulate the current of the coil by obtaining the updated duty cycle.

In some embodiments, the control unit is further configured to: determine a voltage mean value of a voltage of the coil; determine an inrush voltage value when the contactor is being closed; and determine an initial value of the duty cycle based on the voltage mean value and the inrush voltage value.

In some embodiments, updating the duty cycle of the PWM signal based on the difference value comprises: updating the duty cycle based on a product of the difference value and an empirical coefficient.

In some embodiments, determining the initial value of the duty cycle based on the voltage mean value and the inrush voltage value comprises: determining the initial value of the duty cycle based on a ratio of the voltage mean value to the inrush voltage value.

In some embodiments, the controller further comprises: a PWM generator; and an enable module coupled to the PWM generator; wherein the PWM generator is configured to determine a duty cycle of the PWM generator based on the updated duty cycle and an enable signal of the enable module.

In some embodiments, the enable module further comprises: an analog comparator configured to receive an actual current value of the coil and a preset target current value and output the enable signal based on the actual current value and the target current value.

In some embodiments, the PWM generator is configured to determine the duty cycle of the PWM signal based on the updated duty cycle in response to the actual current value being greater than the target current value.

In some embodiments, the PWM generator is configured to maintain the duty cycle of the PWM signal constant in response to the actual current value being smaller than the target current value.

In some embodiments, the controller further comprises a digital-to-analog converter coupled to the analog comparator, the digital-to-analog converter being configured to: receive a digital target current value; convert the digital target current value into an analog target current value; and transmit the analog target current value to the analog comparator.

In some embodiments, the controller further comprises a direct memory accessor coupled to the digital-to-analog converter and configured to transmit the digital target current value to the digital-to-analog converter.

In some embodiments, the controller further comprises a sample frequency setting module coupled to the digital-to-analog converter and configured to set a sample frequency of the digital-to-analog converter.

In a third aspect, embodiments of the present disclosure relate to a system for regulating a current of a coil, comprising: a controller according to the second aspect.

In some embodiments, the system further comprises: an operational amplifier; and a further switch configured to modify an amplification factor of the operational amplifier based on magnitude of the current of the coil.

BRIEF DESCRIPTION OF THE DRAWINGS

Through the following detailed description with reference to the accompanying drawings, the above and other objectives, features, and advantages of embodiments of the present disclosure will be more apparent. In the drawings, a plurality of embodiments of the present disclosure are explained in an exemplary and non-restrictive manner, wherein.

DETAILED DESCRIPTION OF EMBODIMENTS

Figure 1:
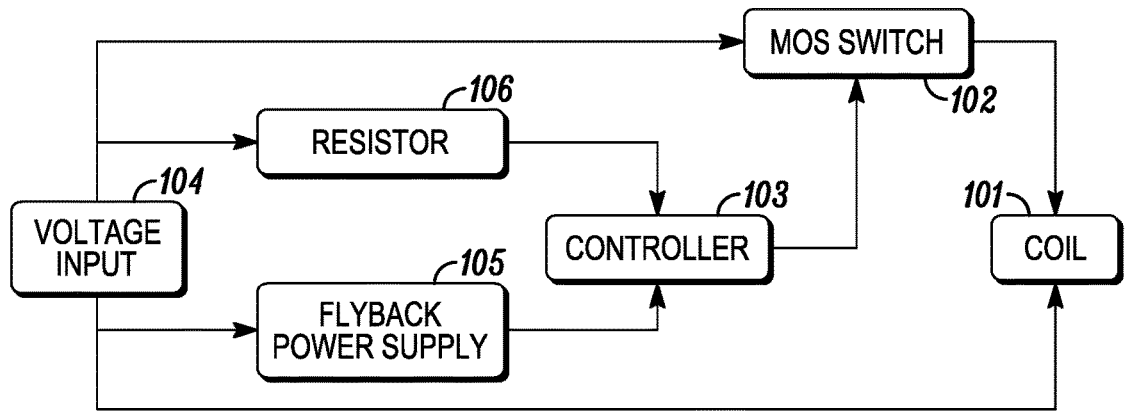
FIG. 1 illustrates a schematic diagram of a circuitry system framework in accordance with the present disclosure.

Principles of the present disclosure are now explained with reference to various example embodiments illustrated in the drawings. It should be appreciated that description of those embodiments is merely to enable those skilled in the art to better understand and further implement the present disclosure and is not intended to limit the scope disclosed herein in any manner. It should be noted similar or same reference signs can be used in the drawings where feasible, and similar or same reference signs may represent similar or same functions. Those skilled in the art will easily understand from the following description that alternative embodiments of the structure and method explained herein can be adopted without departing from the principles of the present invention described herein.

In the descriptions of embodiments of the present disclosure, the term "include" and its variants are to be read as open-ended terms that mean "includes, but is not limited to." The term "based on" is to be read as "based at least in part on." The terms "one embodiment" and "this embodiment" are to be read as "at least one embodiment." The terms "first", "second" and the like can refer to same or different objects. The following text can also comprise other definitions that are explicitly and implicitly stated.

As described above, the service cycle of a coil of contactor is basically divided into an inrush state, a holding state and an open state. When closing the contactor, the generated inrush currents are much higher than those generated in other states. Accordingly, the magnitude of the inrush current should be controlled to prolong the service life of the contactor.

Some example embodiments in accordance with the present disclosure are now described with reference to FIGS. 1 to 2.

FIG. 1 illustrates a schematic diagram of a circuitry system framework in accordance with the present disclosure. In FIG. 1, a controller provides control signals for a MOS switch 102 to control ON and OFF of the MOS switch 102 and further control the currents of the coil 101 of the contactor, especially the inrush currents during when closing the contactor. The control of the current is mainly based on a measure-feedback-control principle.

As illustrated, the framework of FIG. 1 also comprises a Flyback power supply 105 and a resistor 106 coupled to a voltage input 104. The Flyback power supply 105 can receive voltages from the voltage input 104 derived from a power grid and then supply power for a controller 130.

Figure 2:
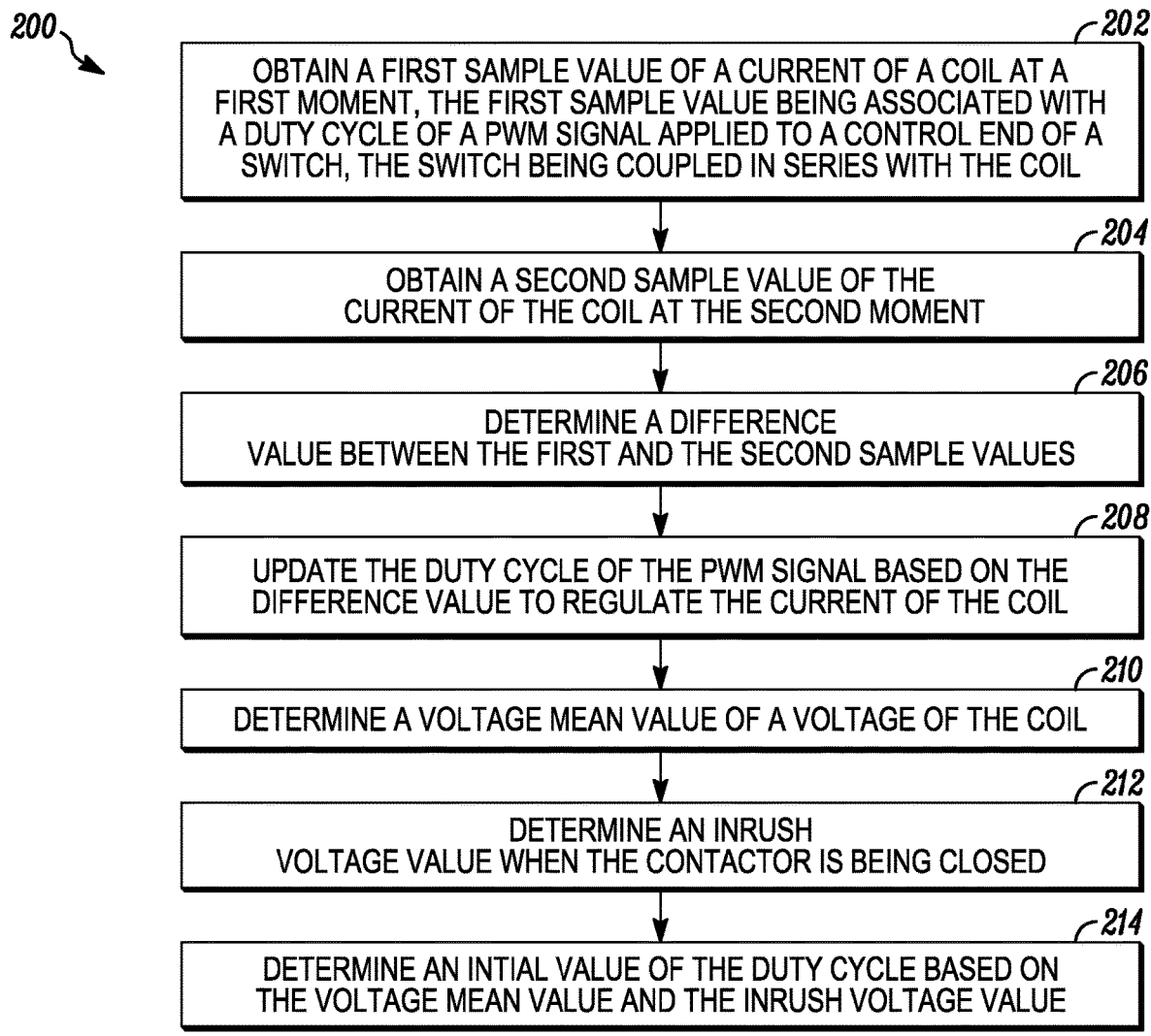
FIG. 2 illustrates a flowchart of a method of regulating currents of a coil in accordance with embodiments of the present disclosure.

Now with reference to FIG. 2. FIG. 2 illustrates a flowchart of a method of regulating currents of a coil in accordance with embodiments of the present disclosure. The method can be performed on an executing device such as microcontroller. With the resources of the microcontroller per se, the present invention fulfills the predetermined functions.

At block 202, a first sample value of a current of the coil at a first moment is obtained, and the first sample value is associated with a duty cycle of a PWM signal applied to the coil. The sample values of the current of the coil according to time series can be obtained and a value $I_n$ of the current at the n-th sample among the sample values serves as a first sample value. The sample value may be related to a duty cycle of the PWM signal applied to the coil to control the magnitude of the current in the circuit.

At block 204, a second sample value of the current of the coil at a second moment is obtained. A value $I_{n-1}$ at the n−1-th sample current is obtained as the second sample value from the sample values of the current according to time series.

At block 206, a difference value between the first and the second sample value is determined. A difference value e is obtained by subtracting the current value $I_{n-1}$ at the n−1-th sample from the current value $I_n$ at the n-th sample.

At block 208, the duty cycle of the PWM signal is updated based on the difference value to regulate the current of the coil. The updated duty cycle of the PWM signal can be obtained through the difference value determined in block 206. The updated duty cycle, for example, can be received by a PWM generator, through which the currents of the coil are regulated.

At block 210, a voltage mean value of a voltage of the coil is determined. At block 212, an inrush voltage value when the contactor is being closed is determined. At block 214, an initial value of the duty cycle based on the voltage mean value and the inrush voltage value is determined.

Through the update of the duty cycle of the PWM generator by the above steps, the currents applied to the coil may be regulated. In this way, the inrush currents can be controlled within a certain range to reduce the impact of the inrush currents on the coil, thus increasing the service life of the coil.

In some embodiments, the method may further comprise a step of determining an initial value of the duty cycle of the PWM signal. The initial value can be obtained using a plurality of methods.

In some embodiments, a voltage mean value $U_{rms}$ of the voltage of coil may be determined. An inrush voltage value $U_{inrush}$ at the moment when closing the contactor is then obtained. The initial value of the duty cycle may be determined based on the voltage mean value $U_{rms}$ and the inrush voltage value $U_{inrush}$.

In some embodiments, the datasets of the voltage mean values $U_{rms}$ and the inrush voltage values $M_{inrush}$ may be obtained with the ADC external devices coupled to the microcontroller and the datasets are provided to the microcontroller.

In some embodiments, the duty cycle may be determined based on a product of the difference value between the first sample value and the second sample value and an empirical coefficient. For example, in some embodiments, $A=A'+k(I_n-I_{n-1})$, where A' indicates the duty cycle corresponding to the current at the n−1-th sample, k is the empirical coefficient and A represents updated duty cycle corresponding to the current at the n-th sample. It is to be understood that the duty cycle can be updated with different calculating methods according to various contactors. The specific calculating method is not restricted to embodiments of the present disclosure.

In some embodiments, the initial value A of the duty cycle may be determined based on a ratio of the voltage mean value $U_{rms}$ to the inrush voltage value $M_{inrush}$ combining the empirical coefficient. In some embodiments, $A=U_{rms}/(U_{inrush}*0.9)$, where 0.9 is the empirical coefficient. The empirical coefficient can be set to other values according to different contactors. The specific value is not restricted to embodiments of the present disclosure.

In some embodiments, in response to the running time of the program being smaller than a predetermined time, the step of obtaining the first sample value and the second sample value restarts. The predetermined time may be determined by a time-out period of the inrush current. The predetermined time for example can be 70 milliseconds.

In some embodiments, in response to the running time of the program being greater than a predetermined time, the operation of the program is terminated.

In a second aspect, embodiments of the present disclosure further relate to a controller for performing the above method. The controller is described hereinafter with reference to FIG. 3, which illustrates a schematic diagram of the configuration of the controller 103 in accordance with embodiments of the present disclosure.

In some embodiments, the controller 103 may also include a PWM generator 304 and an enable module 311 coupled to the PWM generator. The PWM generator 304 determines the duty cycle of the PWM generator using the duty cycle obtained from the above method based on an enable signal of the enable module 311.

In some embodiments, the enable module 311 may include an analog comparator 305 coupled to the PWM generator 304. The analog comparator 305 may receive an actual current value 306 and a target current value 307 of the coil 101 and output an enable signal based on the two current values, wherein the target current value 307 is the maximum value of the inrush current of the coil 101 expected by users.

Figure 3:
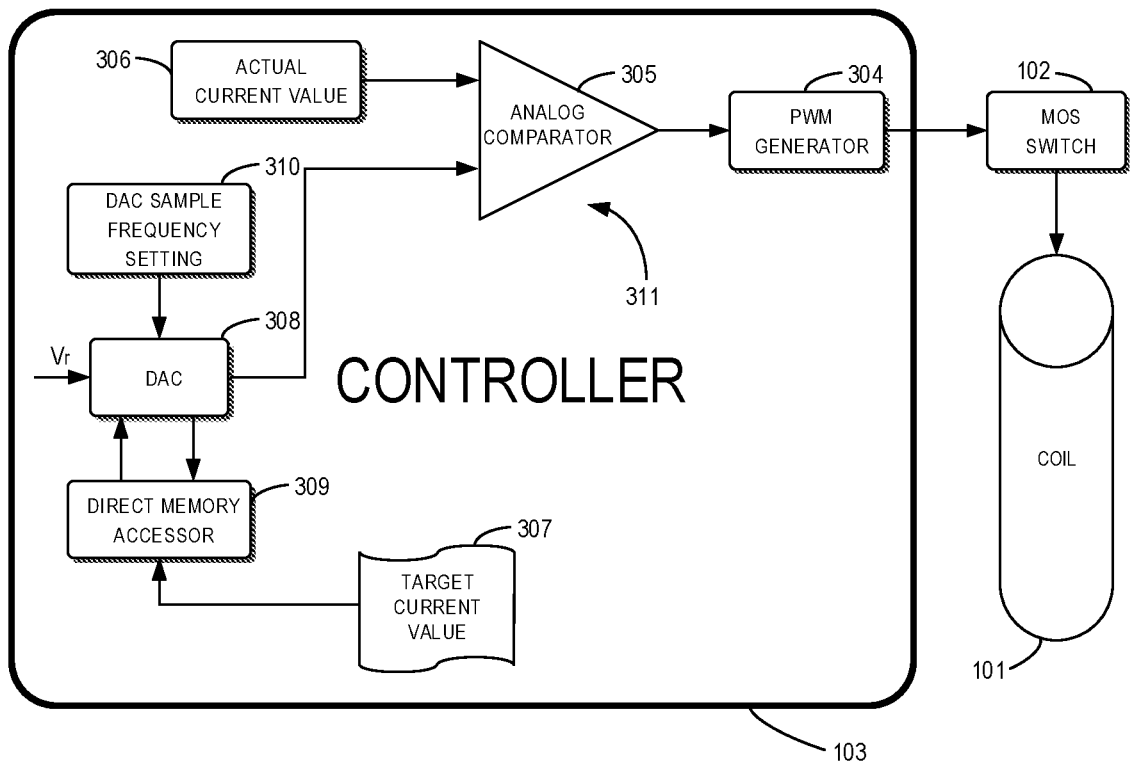
FIG. 3 illustrates a schematic diagram of the configuration of the controller in accordance with embodiments of the present disclosure.

In some embodiments, in response to the actual current value 306 being greater than the target current value 307, the enable signal may be 1, as illustrated in FIG. 3. A duty cycle of a clock module in the PWM generator 304 is determined based on the duty cycle updated according to the above method, so as to update the current of the coil. Meanwhile, the updated coil current will feedback a coil current signal again for continuous self-correction until the current of the coil is held at a predetermined expected value. Such a function can be completed by the hardware totally on its own without occupying CPU resources as long as the setting is made during initialization of the microcontroller.

In some embodiments, in response to the actual current value 306 being smaller than the target current value 307, the enable signal may be 0 and the duty cycle of the clock module of the PWM generator 304 is maintained at the current value, as shown in FIG. 3.

In some embodiments, the controller 103 may further comprise a Digital-to-Analog Converter (DAC) 308 coupled to the analog comparator 305. The Digital-to-Analog Converter 308 is configured to transmit the target current value 307 to the analog comparator 305.

In some embodiments, the controller 103 may further comprise a direct memory accessor 309 coupled to the Digital-to-Analog Converter. The direct memory accessor 309 is configured to transmit the target current value 307 to the Digital-to-Analog Converter 308.

In some embodiments, the controller further may further comprise a sample frequency setting module 310 coupled to the Digital-to-Analog Converter 308 and configured to set the DAC sample frequency.

In a third aspect, embodiments of the present disclosure relate to a system comprising the above controller.

In some embodiments, the system may comprise an amplification-factor selecting circuit coupled to the controller 103.

The amplification-factor selecting circuit 400 will be described hereinafter with reference to FIG. 4, which illustrates a schematic diagram of the amplification-factor selecting circuit 400 in accordance with embodiments of the present disclosure.

Figure 4:
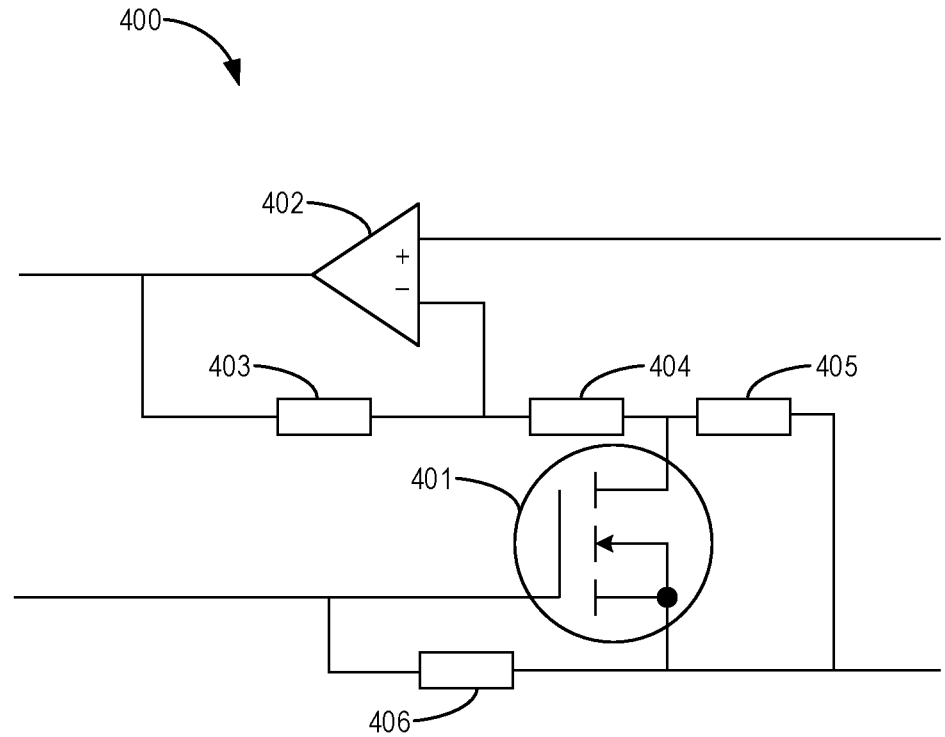
FIG. 4 illustrates a schematic diagram of an amplification-factor selecting circuit in accordance with embodiments of the present disclosure.

As shown in FIG. 4, the amplification-factor selecting circuit 400 includes an operational amplifier 402. The controller 103 may further detect the currents of the coil 101 in real time and determines that the present currents are inrush currents in response to the real-time currents of the coil 101 exceeding a predetermined current threshold; or determines that the present currents are holding currents in response to the real-time currents of the coil 101 being lower than the current threshold. The controller 103 controls ON and OFF of the MOS switch 401 in accordance with the determination result. The amplification-factor selecting circuit 400 includes a plurality of resistors 403-406 coupled therein. The resistance values in the circuit changes in response to ON or OFF of the MOS switch 401, to further choose a suitable amplification factor for the operational amplifier 402, thereby adjusting the current appropriately prior to sampling.

In this way, both the large currents like inrush currents and the small currents such as holding currents can be accurately measured, so as to provide accurate current measurements to the controller.

The method of regulating currents of the coil of the contactor in accordance with embodiments of the present disclosure can control the inrush currents without modifying the structure of the hardware circuit, which further ensures long service life of the contactor.

Although the claims of the present application are made for certain combinations of the features, it should be appreciated that the scope of the present disclosure also includes any explicitly or implicitly summarized novel features or novel combinations of the features no matter whether or not the features relate to the same solutions in any claims sought for protection.

We claim:

1. A method of regulating a current of a coil of a contactor, comprising:
    obtaining a first sample value of the current of the coil at a first moment, the first sample value being associated with a duty cycle of a PWM signal applied to a control end of a switch, and the switch being coupled in series with the coil;
    obtaining a second sample value of the current of the coil at a second moment;
    determining a difference value between the first and the second sample values;
    updating the duty cycle of the PWM signal based on the difference value to regulate the current of the coil;
    determining a voltage mean value of a voltage of the coil;
    determining an inrush voltage value when the contactor is being closed; and
    determining an initial value of the duty cycle based on the voltage mean value and the inrush voltage value.

2. The method of claim 1, wherein updating the duty cycle of the PWM signal based on the difference value comprises:
updating the duty cycle based on a product of the difference value and an empirical coefficient.

3. The method of claim 1, wherein determining the initial value of the duty cycle based on the voltage mean value and the inrush voltage value comprises:
determining the initial value of the duty cycle based on a ratio of the voltage mean value to the inrush voltage value.

4. A controller for regulating a current of a coil of a contactor, comprising:
a control unit configured to:
obtain a first sample value of the current of the coil at a first moment, the first sample value being associated with a duty cycle of a PWM signal applied to a switch, the switch being coupled in series with the coil;
obtain a second sample value of the current of the coil at a second moment;
determine a difference value between the first and the second sample values;
update the duty cycle of the PWM signal based on the difference value to regulate the current of the coil by obtaining an updated duty cycle;
determine a voltage mean value of a voltage of the coil;
determine an inrush voltage value when the contactor is being closed; and
determine an initial value of the duty cycle based on the voltage mean value and the inrush voltage value.

5. The controller of claim 4, wherein updating the duty cycle of the PWM signal based on the difference value comprises:
updating the duty cycle based on a product of the difference value and an empirical coefficient.

6. The controller of claim 4, wherein determining the initial value of the duty cycle based on the voltage mean value and the inrush voltage value comprises:
determining the initial value of the duty cycle based on a ratio of the voltage mean value to the inrush voltage value.

7. The controller of claim 4, further comprising:
a PWM generator; and
an enable module coupled to the PWM generator;
wherein the PWM generator is configured to determine a duty cycle of the PWM generator based on the updated duty cycle and an enable signal of the enable module.

8. The controller of claim 7, wherein the enable module further comprises:
an analog comparator configured to receive an actual current value of the coil and a preset target current value and output the enable signal based on the actual current value and the preset target current value.

9. The controller of claim 8, wherein the PWM generator is configured to determine the duty cycle of the PWM signal based on the updated duty cycle in response to the actual current value being greater than the target current value.

10. The controller of claim 8, wherein the PWM generator is configured to maintain the duty cycle of the PWM signal constant in response to the actual current value being smaller than the target current value.

11. The controller of claim 8, further comprising a digital-to-analog converter coupled to the analog comparator, the digital-to-analog converter being configured to:
receive a digital target current value;
convert the digital target current value into an analog target current value; and
transmit the analog target current value to the analog comparator.

12. The controller of claim 11, further comprising a direct memory accessor coupled to the digital-to-analog converter and configured to transmit the digital target current value to the digital-to-analog converter.

13. The controller of claim 11, further comprising a sample frequency setting module coupled to the digital-to-analog converter and configured to set a sample frequency of the digital-to-analog converter.

14. A system for regulating a current of the coil, comprising:
the controller according to claim 4.

15. The system of claim 14, further comprising:
an operational amplifier; and
a further switch configured to modify an amplification factor of the operational amplifier based on magnitude of the current of the coil.

* * * * *